(12) United States Patent
Muka

(10) Patent No.: US 6,261,048 B1
(45) Date of Patent: *Jul. 17, 2001

(54) MULTI-LEVEL SUBSTRATE PROCESSING APPARATUS

(75) Inventor: Richard S. Muka, Topsfield, MA (US)

(73) Assignee: Brooks Automation, Inc., Chelmsford, MA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/435,702

(22) Filed: Nov. 8, 1999

Related U.S. Application Data

(63) Continuation of application No. 08/662,930, filed on Jun. 13, 1996, now Pat. No. 6,062,798.

(51) Int. Cl.$^7$ .................................................. B65G 1/04
(52) U.S. Cl. ........................ 414/416; 414/222; 414/939
(58) Field of Search .................... 414/416, 222, 414/937, 939; 901/15

(56) References Cited

U.S. PATENT DOCUMENTS

| | | | |
|---|---|---|---|
| 1,190,215 | 7/1916 | Becker . | |
| 2,282,608 | 5/1942 | Rempel . | |
| 3,730,595 | 5/1973 | Yakubowski | 302/2 R |
| 3,768,714 | 10/1973 | Applequist et al. | 226/37 |
| 3,823,836 | 7/1974 | Cheney et al. . | |
| 3,874,525 | 4/1975 | Hassan et al. . | |
| 4,062,463 | 12/1977 | Hillman et al. . | |
| 4,094,722 | 6/1978 | Yamamoto et al. | 156/345 |
| 4,109,170 | 8/1978 | Fujita et al. | 310/68 R |
| 4,208,159 | 6/1980 | Uehara et al. | 414/225 |
| 4,381,965 | 5/1983 | Maher, Jr. et al. | 156/345 |
| 4,666,366 | 5/1987 | David | 414/749 |
| 4,675,096 | 6/1987 | Tateishi et al. | 204/298 |
| 4,721,971 | 1/1988 | Scott | 354/105 |
| 4,730,975 | 3/1988 | Munakata | 414/735 |
| 4,836,733 | 6/1989 | Hertel et al. | 414/225 |
| 4,864,205 | 9/1989 | Fisher et al. | 318/568.11 |
| 4,907,467 | 3/1990 | Toyoda et al. | 74/479 |
| 4,909,701 | 3/1990 | Hardegen et al. | 414/749 |
| 4,951,601 | 8/1990 | Mayden et al. | 118/719 |
| 5,151,008 | 9/1992 | Ishida et al. | 414/744.5 |
| 5,180,276 | 1/1993 | Hendrickson | 414/752 |
| 5,270,600 | 12/1993 | Hashimoto | 310/75 D |
| 5,279,309 | 1/1994 | Taylor et al. | 128/782 |
| 5,333,986 | 8/1994 | Mizukami et al. | 414/217 |
| 5,447,409 | 9/1995 | Grunes et al. | 414/744.6 |
| 5,486,080 | 1/1996 | Sieradzki | 414/217 |
| 5,515,986 | 5/1996 | Turlot et al. . | |
| 5,558,487 | 9/1996 | Nakagawa | 414/744.6 |
| 5,562,383 | 10/1996 | Iwai et al. | 414/217 |
| 5,674,039 | 10/1997 | Walker et al. | 414/416 X |
| 5,685,684 | 11/1997 | Kato et al. | 414/416 X |
| 6,062,798 | * 5/2000 | Muka | 414/416 |

FOREIGN PATENT DOCUMENTS

| | | |
|---|---|---|
| 0423608 | 4/1991 | (EP) . |
| 2-292153 | 12/1990 | (JP) . |
| 4-157755 | 5/1992 | (JP) . |

OTHER PUBLICATIONS

Prospectus for Mattson Technology, Inc., pp3 and 20–30, 1994.

* cited by examiner

Primary Examiner—Stephen T. Gordon
(74) Attorney, Agent, or Firm—Perman & Green, LLP

(57) ABSTRACT

A substrate processing apparatus having a substrate transport and substrate processing chambers. The substrate transport has a transport chamber and a transport mechanism. The transport mechanism has a rotatable drive, an arm pivotably connected to the drive to pivot in vertical directions, and a substrate holder pivotably connected to an end of the arm by an articulating wrist. The arm can vertically move the substrate holder up and down. The substrate processing chambers are stationarily connected to the transport chamber at two different vertical levels.

24 Claims, 4 Drawing Sheets

MULTI-LEVEL SUBSTRATE PROCESSING APPARATUS

CROSS REFERENCE TO RELATED APPLICATION

This is a continuation patent application of application Ser. No. 08/662,930 filed Jun. 13, 1996, now U.S. Pat. No. 6,062,798.

BACKGROUND OF THE INVENTION

1. Field of the Invention

This invention relates to a substrate processing apparatus and, more particularly, to an apparatus having substrate processing chambers at different vertical levels on a transport chamber.

2. Prior Art

Mattson Technology has a system known as its ASPEN system that moves two semi-conductor wafers into and out of a process chamber at the same time. Batch systems, single wafer systems and cluster tool systems are also known in the prior art. U.S. Pat. No. 4,951,601 discloses a substrate processing apparatus with multiple processing chambers and a substrate transport apparatus. U.S. Pat. No. 5,180,276 discloses a substrate transport apparatus with two a substrate holders. U.S. Pat. No. 5,270,600 discloses a coaxial drive shaft assembly of a substrate transport apparatus. U.S. Pat. No. 4,094,722 discloses a rotatable palette that holds four wafers. U.S. Pat. No. 4,381,965 discloses a multi-planar electrode plasma etcher. U.S. Pat. No. 4,675,096 discloses a take-in-and-out chamber with side-by-side take-in and take-out positions. Other related art includes the following:

U.S. Pat. No. : 1,190,215 U.S. Pat. No. : 2,282,608
U.S. Pat. No. : 3,730,595 U.S. Pat. No. : 3,768,714
U.S. Pat. No. : 3,823,836 U.S. Pat. No. : 3,874,525
U.S. Pat. No. : 4,062,463 U.S. Pat. No. : 4,109,170
U.S. Pat. No. : 4,208,159 U.S. Pat. No. : 4,666,366
U.S. Pat. No. : 4,721,971 U.S. Pat. No. : 4,730,975
U.S. Pat. No. : 4,907,467 U.S. Pat. No. : 4,909,701
U.S. Pat. No. : 5,151,008 U.S. Pat. No. : 5,333,986
U.S. Pat. No. : 5,447,409
EPO Publication No.: 0423608
Japanese Publication No.: 2-292153

SUMMARY OF THE INVENTION

In accordance with one embodiment of the present invention, a substrate processing apparatus is provided comprising a substrate transport and substrate processing chambers. The substrate transport has a transport chamber and a transport mechanism for transporting substrates into and out of the transport chamber. The substrate processing chambers are stationarily connected to the transport chamber. A first one of the processing chambers is vertically orientated in a plane above a second one of the processing chambers. The transport mechanism can transport substrates into and out of the first and second processing chambers.

In accordance with another embodiment of the present invention, a substrate transport mechanism for transporting substrates into and out of substrate processing chambers is provided comprising a rotatable drive, a first arm, and a first substrate holder. The first arm is pivotably connected to the drive. The arm has a first arm section pivotably connected to a second arm section. The first substrate holder is pivotably connected to the second arm section. At least one of the arm sections pivotably moves in a vertical direction when it is pivoted.

In accordance with another embodiment of the present invention, a substrate transport mechanism for transporting substrates into and out of substrate processing chambers is provided comprising a first arm and a substrate holder. The first arm has two arm sections pivotably connected to each other to move in parallel vertical directions when they are pivoted relative to each other. The substrate holder is movably mounted to one of the arm sections by an articulating wrist. The wrist pivots in at least two directions to maintain the substrate holder in a horizontal position.

In accordance with another embodiment of the present invention, a substrate processing apparatus is provided comprising a substrate transport, substrate processing chambers, and a controller. The substrate transport has a transport chamber and a substrate transport mechanism. The substrate processing chambers are stationarily connected to the transport chamber. The processing chambers are located in at least two vertically different horizontal planes with at least one of the horizontal planes having at least two processing chambers. The controller is for controlling the substrate transport mechanism to insert and remove substrates from the processing chambers at the vertically different horizontal planes.

In accordance with another embodiment of the present invention, a substrate transport mechanism for a substrate processing apparatus is provided comprising a drive, two arms, and two substrate holders. The arms are pivotably connected to the drive to move in vertical directions. Each arm has at least two arm sections. Each one of the substrate holders are connected to a separate one of the arms.

In accordance with one method of the present invention, a method of moving substrates in a substrate processing apparatus is provided comprising steps of providing a substrate transport mechanism with serially connected members that are pivotably connected to each other. One of the members comprising a substrate holder connected at an end of the transport mechanism; and controlling pivotable movement of the members relative to each other to move the substrate holder substantially straight into and out of substrate processing chambers.

In accordance with another method of the present invention, a method of moving substrates in a substrate processing apparatus is provided comprising steps of providing a substrate transport mechanism with an arm connecting a drive to a substrate holder, the arm having two serially connected arm sections pivotably connected to each other at a middle joint and pivotably connected to the drive at an inner joint, the substrate holder being pivotably connected to the arm for movement along at least two axes of rotation at an end joint; and controlling rotational movement of the arm sections, the substrate holder and the drive to move the substrate holder into and out of the substrate processing chambers at different vertical locations and different horizontal locations.

BRIEF DESCRIPTION OF THE DRAWINGS

The foregoing aspects and other features of the invention are explained in the following description, taken in connection with the accompanying drawings, wherein.

DETAILED DESCRIPTION OF THE PREFERRED EMBODIMENTS

Figure 1:
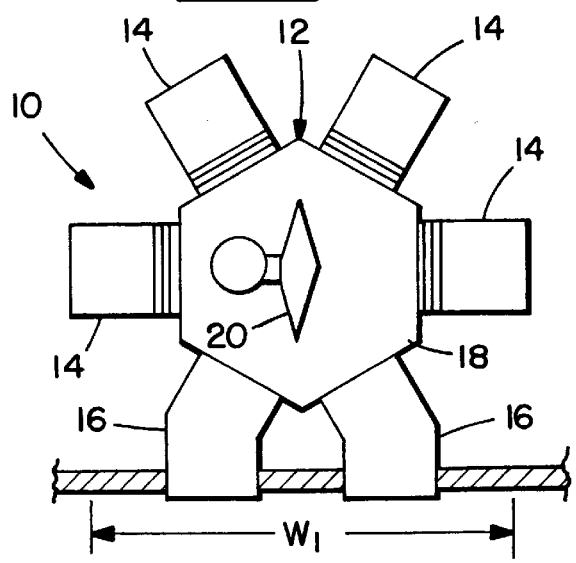
FIG. 1 is a schematic top view of a prior art substrate processing apparatus.

Referring to FIG. 1, there is shown a prior art substrate processing apparatus 10. The apparatus 10 has a transport 12, four substrate processing modules 14, and two substrate elevator modules 16. The transport 10 has a transport chamber 18 and a transport mechanism 20. The transport mechanism 20 is able to move substrates among the various substrate processing modules 14 and elevator modules 16.

Figure 2:
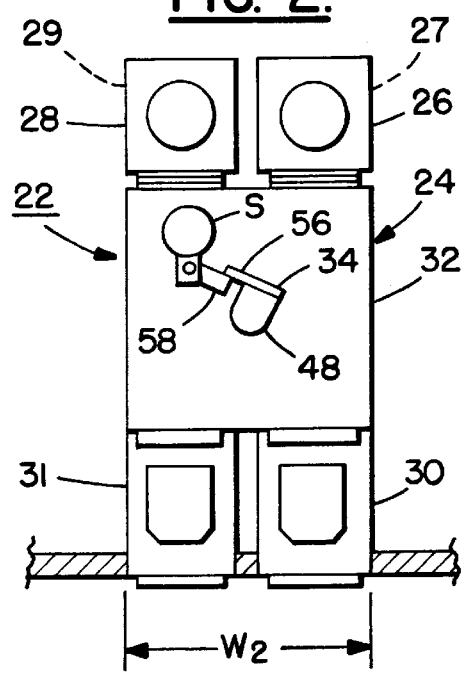
FIG. 2 is a schematic top view of a substrate processing apparatus incorporating features of the present invention.

Referring now to FIG. 2, a substrate processing apparatus 22 is shown that incorporates features of the present invention. The apparatus 22 includes a transport 24, four substrate processing modules 26, 27, 28, 29 and two substrate elevator modules 30, 31.

Figure 3:
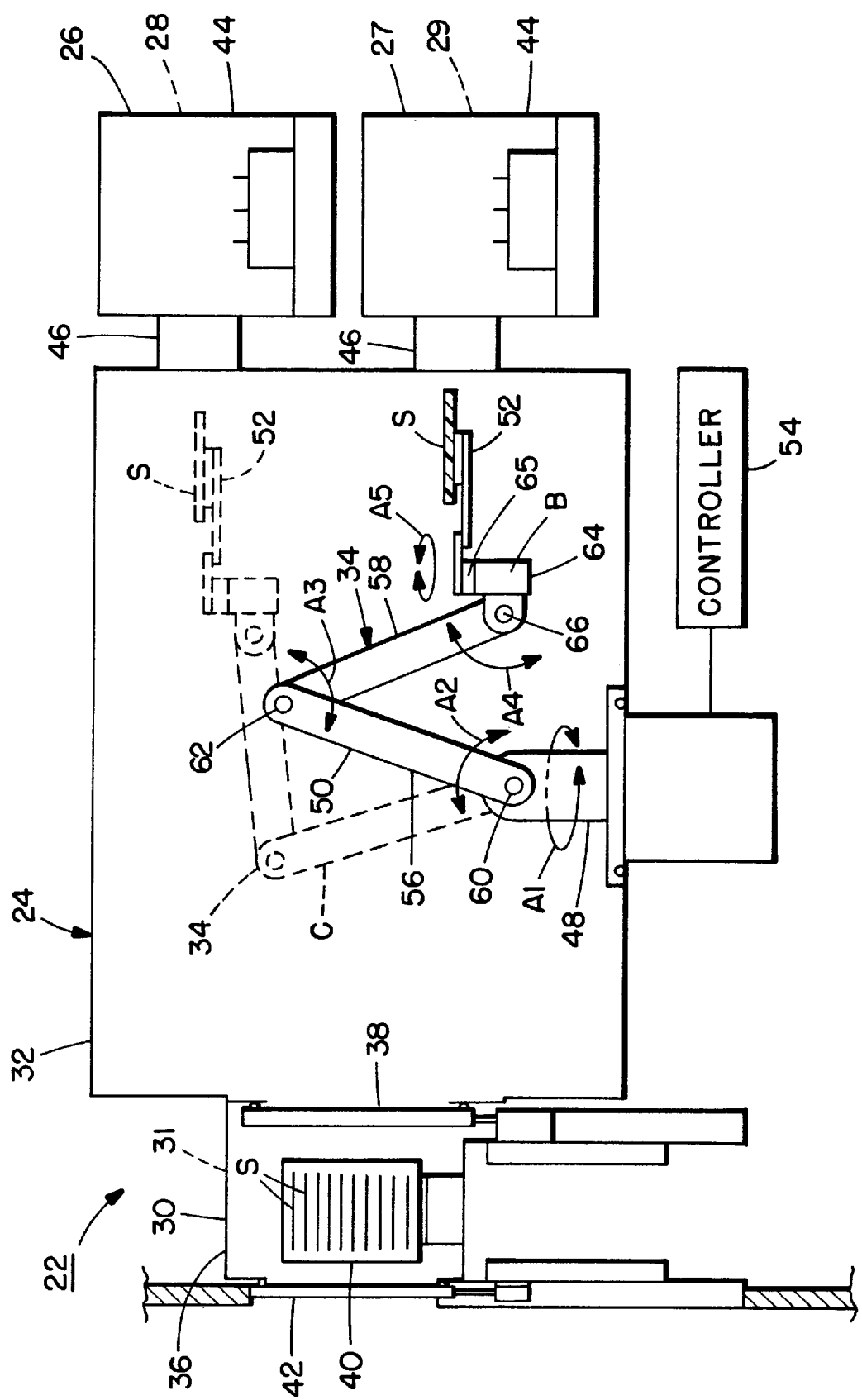
FIG. 3 is a schematic side view of the apparatus shown in FIG. 2.

The transport 24 includes a transport chamber 32 and a transport mechanism 34. In the embodiment shown, the transport chamber 32 has a general square shape with the two substrate elevator modules 30, 31 connected to one side and the four process modules 26, 27, 28, 29 connected to an opposite side. Referring also to FIG. 3, the elevator modules 30, 31 each have a frame 36 stationarily connected to the transport chamber 32. A movable gate or door 38 is to provide at each of the junctions of the transport chamber 32 with the elevator modules 30, 31. The elevator modules 30, 31 each hold a cassette 40 of substrates S. The cassettes 40 can be moved up and down by the elevator modules 30, 31. Another movable gate or door 42 is provided at each of the elevator modules 30, 31 to insert and remove the cassettes 40. In alternate embodiments any suitable type of substrate elevator modules or substrate supply modules could be provided.

The substrate processing modules 26, 27, 28, 29 each comprise a frame 44 that is stationarily connected to the transport chamber 32 with a gate mechanism 46 therebetween. The gate mechanisms 46 allow a path to be opened between the chamber 32 and the modules 26, 27, 28, 29 and can be moved to close the path to seal off the modules 26, 27, 28, 29 from the chamber 32. The modules 26–29 can be configured to provide any suitable type of substrate processing including heating or cooling of the substrates. In the embodiment shown the processing modules 26, 27, 28, 29 are arranged in two stacked configurations. The first module 26 is located vertically above the second module 27. The third module 28 is located vertically above the fourth module 29. In an alternate embodiment, the first module 26 could be located above the second module 27, but not vertically aligned. For example, the center axis of the first module 26 could be slightly offset from the center axis of the second module 27. Another alternative could include the first module 26 being totally offset relative to the second module. The same offsets could be provided for the third module 28 relative to the fourth module 29 or, any suitable combinations of offset and/or aligned modules or pairs of modules could be provided. The two pairs of modules 26, 27 and 28, 29 are located side-by-side next to each other. As seen in comparing the apparatus 10 in FIG. 1 to the apparatus 22 in FIG. 2, the frontal width $W_2$ of the apparatus 22 is significantly smaller than the frontal width $W_1$ of the apparatus 10. In situations where multiple substrate processing apparatus are placed in a same room, the configuration of the apparatus 22 will allow more of them to be placed side-by-side in a given floor space than the old apparatus 10. Both the old apparatus 10 and the apparatus 22 have the same number of processing modules; four. They both can perform identical functions in substantially the same amount of time. If the same number of apparatuses 22 are used, less floor space has to be used than would have been used with the old apparatus 10. Likewise, more apparatus 22 can be used in the same amount of floor space as the old apparatus 10. The apparatus 22 can also be placed in a very close side-by-side arrangement with easy access to the processing modules 26, 27, 28, 29 (all on one side) for maintenance or repair.

The old transport mechanism 20 only needed to move substrates in a single horizontal plane; with perhaps small vertical movements to load and unload substrates. The transport mechanism 34, on the other hand, needs to be able to vertically move substrates for entry into and removal from the vertically offset upper modules 26, 28 and lower modules 27, 29. In the embodiment shown in FIG. 3, the transport mechanism 34 includes a rotatable drive 48, an arm 50, and a substrate holder 52. The rotatable drive 48 is connected to a main controller 54. The main controller 54 includes a computer that is also connected other components of the apparatus 22, such as the gates 38, 42 and 46. The controller 54 controls axial rotation of the drive 48 as indicated by arrow A1. The arm 50 generally comprises a first arm section 56 and a second arm section 58. The first arm section 56 is pivotably connected to the drive 48 at the joint 60 to rotate relative to the drive 48, as indicated by arrow A2, only in a vertical direction. In other words, the first arm section 56 is constrained from moving relative to the drive 48 other than in a pivotal vertical direction. The second arm section 58 has one end pivotably connected to the opposite end of the first arm section 56 at joint 62 as indicated by arrow A3. This connection is also constrained such that the second arm section 58 can only pivot in a vertical direction relative to the first arm section 56. Located at the opposite end of the second arm section 58 is an articulating wrist 64. The wrist 64 connects the substrate holder 52 to the arm 50. The wrist 64 is pivotably mounted to the arm 50 at joint 66 as indicated by arrow A4. The connection at the joint 66 is constrained such that the wrist 64 can only pivot in a vertical direction relative to the second arm section 58 at that joint 66. The substrate holder 52 is pivotably connected to the top of the wrist 64 as indicated by arrow A5. This connection is also constrained such that the substrate holder 52 can only pivot in a horizontal direction relative to the wrist 64 at that connection.

Figure 4:
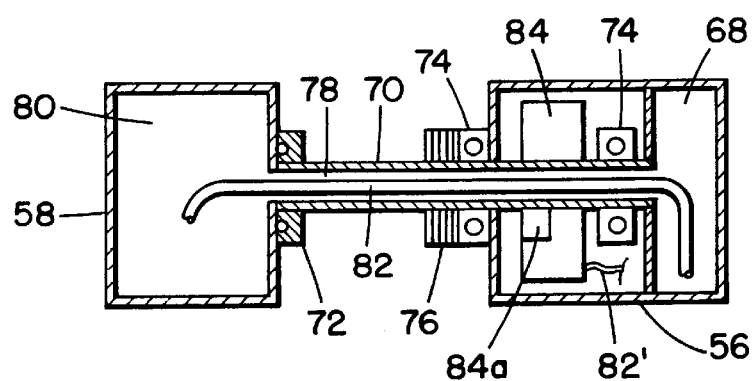
FIG. 4 is a schematic cross-sectional view of the joint between the two arm sections shown in FIG. 3.

FIG. 3 shows the transport mechanism 34 at a position B about to insert the substrate S into the lower right processing module 27. FIG. 3 also shows the transport mechanism 34 in dotted lines at a different position C about to insert the substrate S into the upper right processing module 26. As can be. noted in comparing positions B and C, in both positions B and C the substrate holder 52 is horizontally level. More specifically, the transport mechanism 34 keeps the substrate holder horizontally level in all positions of the transport mechanism 34. This helps to prevent the substrate S from moving on the substrate holder 52. Referring also to FIG. 4, the area at the joint 62 is shown. As can be seen, the first arm section 56 has a channel 68 therethrough. The second arm section 58 is connected to the first arm section 56 by a shaft 70. The shaft 70 is fixedly connected to the second arm section 58 with a vacuum seal 72 at the joint. The shaft 70 extends into the first arm section 56 and is rotatably connected by two bearings 74. An atmospheric to vacuum seal, such as ferrofluidic seal 76 or a lip seal, is provided at the entry of the shaft 70 into the first arm section 56. The shaft 70 has a channel 78 therethrough and the second arm section 58 has a channel 80 therethrough. The three channels 68, 78 and 80 provide a path for a control cable 82 to pass through the arm 50 to the wrist 64 and perhaps to the substrate holder 52. Located in the first arm section 56 is a joint movement control section 84. In the embodiment shown, the joint movement control section 84 is an electric motor that is adapted to axially rotate the shaft 70 relative to the first arm section 56. The joint movement control section 84 is connected to a portion 82' of the control cable 82. In the embodiment shown, the control cable 82 is an electrical cable that extends back to the controller 54 and/or a power supply (not shown) through the rotatable drive 48. The connection of the first arm section 56 to the rotatable drive 48 at the joint 60 is substantially identical to that of the joint 62. Likewise, the connection of the wrist 64 to the end of the second arm section 58 at the joint 66 is substantially identical to that of the joint 62. However, in alternate embodiments any suitable type of mechanical joint structure or connection could be provided at the three joints 60, 62, 66. In addition, the joint structures need not be substantially identical. Although the joint movement control section 84 has been described as an electric motor, it preferably also includes an electrical position sensor or encoder 84a to signal position of the two members relative to each other. In an alternate embodiment, the position encoder could be optical. The control cable 82 could include hydraulic or pneumatic conduits. The channels 68, 78 and 80 could also have another cable or conduit extending therethrough to the connection with the substrate holder 52, such as for a device or mechanism (not shown) for assisting in holding the substrate S to the substrate holder 52. The wrist 64 also includes a horizontal rotation section 65 that is connected to the substrate holder 52 to provide rotation as indicated by arrow A5. The transport chamber 32 is preferably maintained without an atmosphere; i.e.: in a vacuum. However, the channels 68, 78, 80 are preferably open to the atmosphere. This is why the seals 72, 76 and other seals (not shown) are provided at the joints. The channels 68, 78, 80 are preferably sealed off from the vacuum of the transport chamber 32 to both protect the control cables and the other controls in the arm and to protect the environment of the chamber 32. The control cables and other controls in the arm are kept separate from the chamber 32 to prevent corrosion from corrosive gases that might enter the chamber 32 from the modules 26–29, to prevent harmful effects of extreme high and/or low temperatures from the modules, and to insulate the controls from electrical noise interference. The vacuum environment of the chamber 32 is protected from contaminant particulate or gaseous effects from the controls and lubricants at the joints. However, in an alternate embodiment, the channels 68, 78, 80 could be maintained in a vacuum.

As noted above, the substrate holder 52 should be kept horizontally level to prevent the substrate S from moving on the holder. In order to accomplish this, the controller 54 automatically controls rotation of the wrist 64 relative to the arm 50 at pivot point 66 based upon the positions of the two arm sections 56, 58 relative to each other and, based upon the position of the first arm section 56 relative to the rotatable drive 48. The position sensors at the first two joints 60, 62 signal the controller 54 of the positions of the rotatable drive 48, first arm section 56, and second arm section 58 relative to each other. The controller 54 has been preprogrammed to select a position of the wrist 64 relative to the second arm section 58, based upon the preprogrammed information, to keep the substrate holder 52 in a horizontal level position. In an alternate embodiment, the controller could use an algorithm based upon sensed positions of the members 48, 56, 58. In another alternate embodiment the wrist 64 could have an active self-controlled horizontal leveling device. In another alternate embodiment, such as if the substrate is actively grabbed by the holder, non-horizontal substrate motions could be accommodated. In another alternate embodiment, the apparatus 22 could have a three dimensional beacon/optical sensor such as described in U.S. Pat. No. 5,279,309 which is hereby incorporated by reference in its entirety.

Figure 2A:
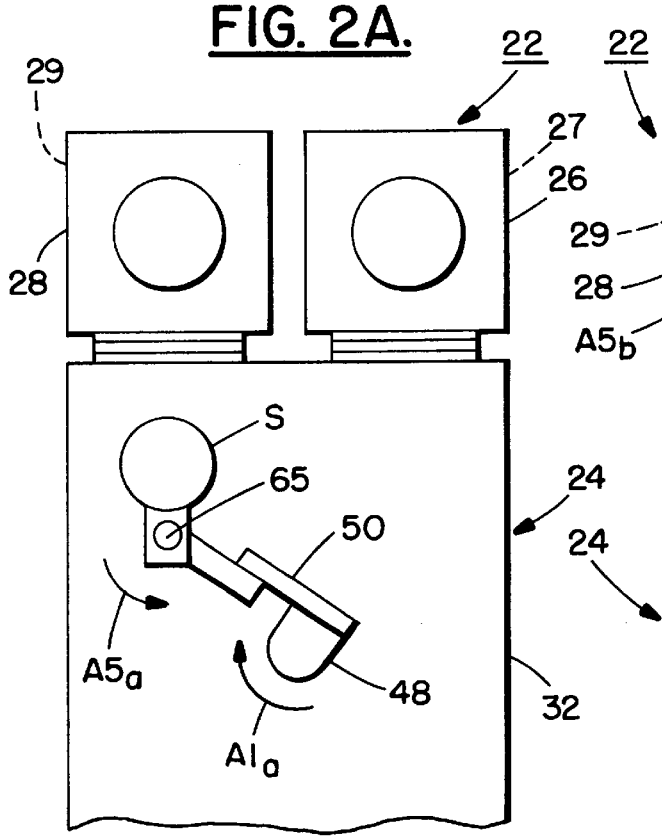
FIG. 2A is a partial schematic view of the apparatus shown in FIG. 2.
Figure 2B:
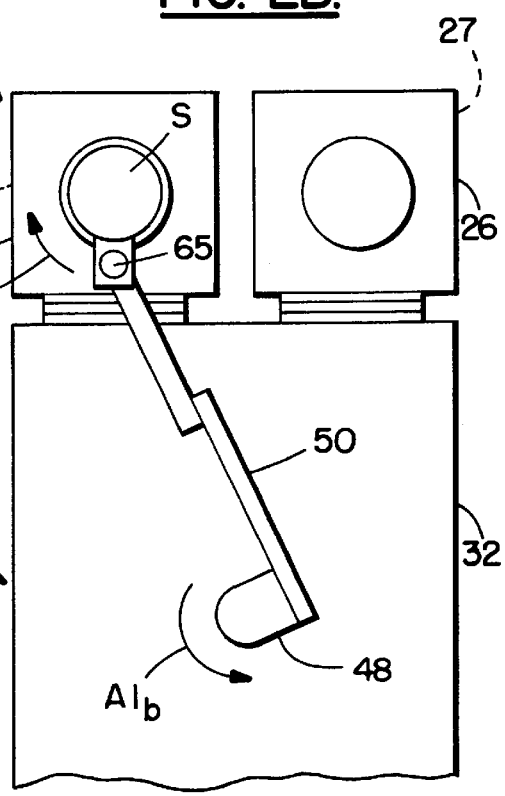
FIG. 2B is a partial schematic view as in FIG. 2A with the arm in an extended position.
Figure 2C:
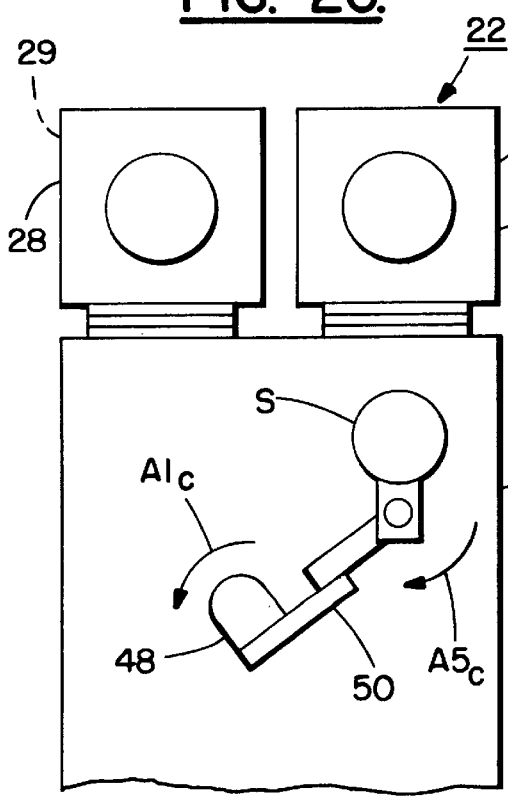
FIG. 2C is a partial schematic view as in FIG. 2A with the arm in a retracted position in front of the right side processing modules.
Figure 2D:
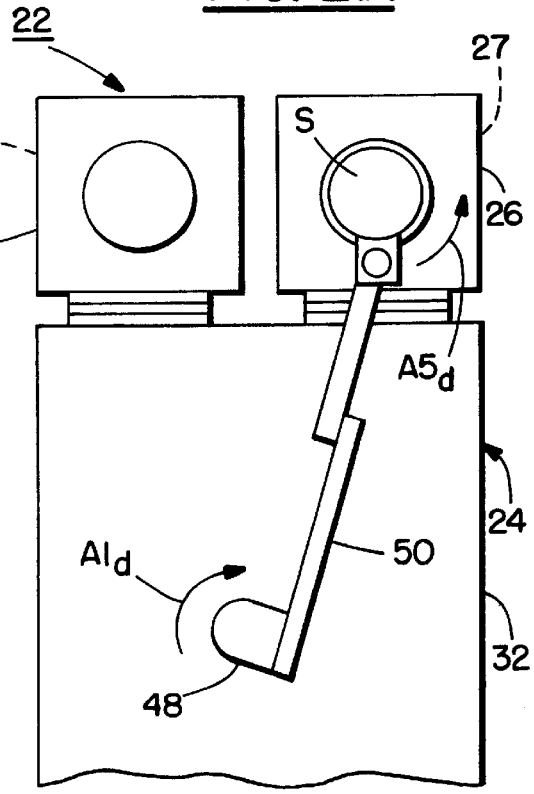
FIG. 2D is a partial schematic view as in FIG. 2C with the arm in an extended position.

The transport mechanism 34 is controlled by the controller 54 to move the substrate holder 52 into and out of the processing modules 26, 27, 28, 29 and elevator modules 30, 31 in a substantially straight manner. In order to accomplish this, the horizontal rotation section 65 and the rotatable drive 48 are rotated as the arm 50 is extended and retracted to compensate for the otherwise generally radially outward or inward movement of the arm 50. For example, referring also to FIGS. 2A and 2B, when the arm 50 is extended from its retracted position shown in FIG. 2A to the extended position shown in FIG. 2B, the rotatable drive 48 is rotated as indicated by arrow $A1_a$ and the horizontal rotation section 65 is rotated as indicated by arrow $A5_a$. The rates of the rotations $A1_a$ and $A5_a$ are controlled by the controller 54 based upon the rotations of the arm sections of the arm 50 such that the substrate holder 52 and substrate S are inserted into the processing module 28 in a substantially straight path. Likewise, when the arm 50 is retracted from its extended position shown in FIG. 2B to its retracted position shown in FIG. 2A, the rotatable drive 48 is rotated as indicated by arrow $A1_b$ and the horizontal rotation section 65 is rotated as indicated by arrow $A5_b$. This allows substantially straight withdrawal of the substrate holder from inside the processing module 28. Similar compensating rotations are provided when the substrate holder 52 is inserted and removed from the lower left processing module 29. Referring also to FIGS. 2C and 2D, extension and retraction of the arm 50 is illustrated with respect to the upper right processing module 26. During extension, compensating rotations $A1_c$ and $A5_c$ are provided. During retraction, compensating rotations $A1_d$ and $A5_d$ are provided. Similar compensating rotations are provided with respect to the lower right processing module 27. Likewise, similar compensating rotations are provided with insertion and retraction relative to the elevator modules 30, 31. In an alternate embodiment, compensating rotations by the rotatable drive 48 and horizontal rotation section 65 need not be provided, such as if the modules 26–31 were suitably arranged and had suitable entrances relative to the transport mechanism's uncompensated movement paths of extension and retraction. In another alternate embodiment, rather than the controller moving the horizontal rotation section 65 and rotatable drive 48 to provide the compensating rotations, the compensating rotations could be provided by direct mechanical linkages to the arm 50 that mechanically rotate the drive 48 and section 65 based upon movement of the arm sections 56 and 58. This could be done by means such as gears, belts, and/or bands, such as disclosed in U.S. Pat. No. 5,431,529 which is hereby incorporated by reference in its entirety. With the ability of the arm 50 to move the substrate holder in vertical directions when the arm sections 56, 58 are pivotably moved, the transport mechanism 34 does not need the rotatable drive 48 to be vertically movable to raise and lower substrates in the modules 26–31. However, the rotatable drive 48 could include a vertical movement mechanism if desired. In another alternate embodiment, the wrist 64 could include a vertical mover connected to the controller 54 to vertically move the substrate holder 52 up and down in the modules 26–31. In another alternate embodiment, the arm 50 could include more than two arm sections. A telescoping arm section in addition to a pivoting arm section could be provided. In another alternate embodiment, a substrate holder that can hold and transport more than on substrate at a time could be used, such as disclosed in U.S. patent application Ser. No. 08/587,087 which is hereby incorporated by reference in its entirety.

Figure 5A:
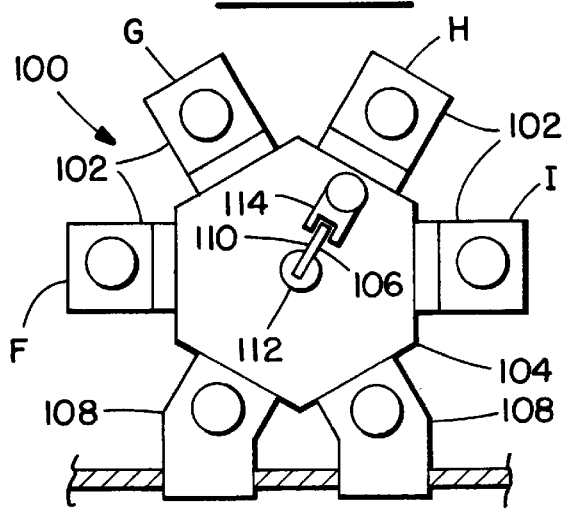
FIG. 5A is a schematic top view of an alternate embodiment of the present invention.
Figure 5B:
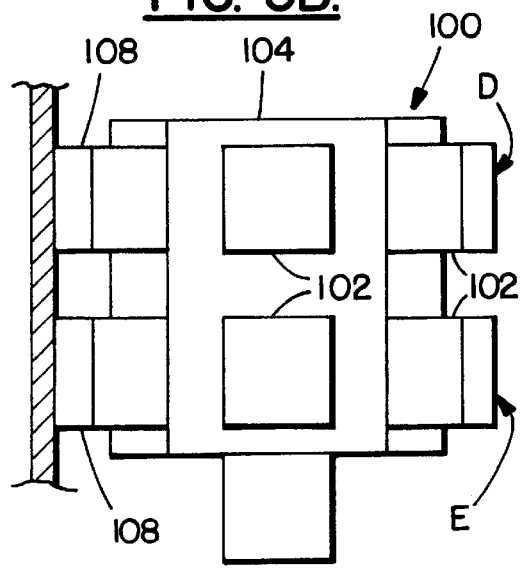
FIG. 5B is a schematic side view of the apparatus shown in FIG. 5A.

Referring now to FIGS. 5A and 5B, an alternate embodiment of the present invention is shown. The substrate processing apparatus 100 has a similar top profile to the apparatus 10 shown in FIG. 1. However, the apparatus 100 has eight processing modules 102, a general hexagon shaped transport chamber 104, a transport mechanism 106, and four elevator modules 108. As seen in FIG. 5B, the apparatus 100 has two levels D and E of processing modules 102. The processing modules 102 are arranged in four positions F, G, H, I with two stacked modules 102 at each position. The transport mechanism 106 is substantially the same as the mechanism 34 shown in FIG. 3. However, in this embodiment, the first arm section 110 is centrally mounted relative to the rotatable drive 112. In addition, the second arm section 114 is mounted to the first arm section 110 to have a center axis in the same plane as the center axis of the first arm section. However, any suitable vertically pivoting arm configuration could be provided. As can be seen in comparing FIG. 1 to FIG. 5A, the footprint of the apparatus 100 is the same as the footprint of the apparatus 10. However, the apparatus 100 has twice as many substrate processing modules and, therefore, can have a higher throughput per area of floor space than the apparatus 10.

Figure 6:
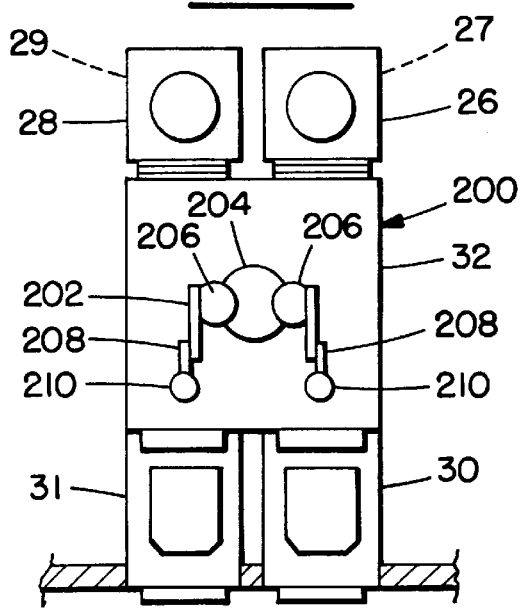
FIG. 6 is a schematic top view of an alternate embodiment of the present invention.

Referring now to FIG. 6, another alternate embodiment is shown. In this embodiment the substrate processing apparatus 200 is substantially the same as the apparatus 22 shown in FIG. 2 except for the transport mechanism 202. The apparatus 200 has the transport chamber 32, the four processing modules 26–29, and the two elevator modules 30, 31. The transport mechanism 202 includes a main rotator 204, two secondary rotators 206, two arms 208, and two substrate holders 210. The main rotator 204 can rotate both secondary rotators 206 and their arms 208 in either clockwise or counterclockwise directions. The two secondary rotators 206 are independently rotatable. Therefore, the main rotator need not be used to move the substrates between the elevator modules 30, 31 and the processing modules 26–29. With this type of embodiment throughput could be increased. The apparatus shown in FIG. 2 could also have a multi-substrate holder rather than two separate substrate holders as shown in FIG. 6. The modules 26–31 would, of course need to be configured to received the multiple substrates and the multi-substrate holder.

Figure 7:
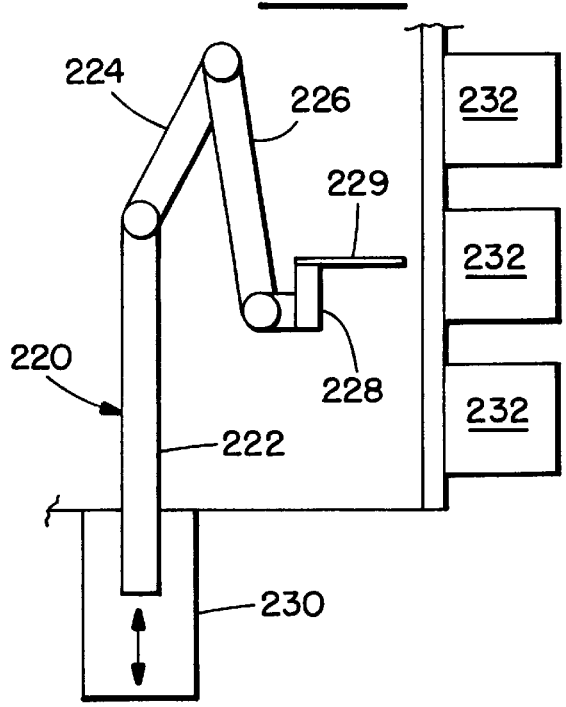
FIG. 7 is a partial schematic side view of another alternate embodiment of the present invention.

Referring now to FIG. 7, another alternate embodiment is shown. In this alternate embodiment the transport mechanism 220 has three arms 222, 224, 226, an articulating wrist 228, a substrate holder 229, and a vertical mover 230. The substrate processing apparatus also includes three levels of processing modules 232 located in a vertical column. The mover 230 is adapted to vertically move the first arm 222 up and down. The first arm 222 is maintained in a substantially vertical orientation and, the mover can also axially rotate the first arm 222 to rotate the other arms 224, 226, wrist 228 and holder 229 about the center axis of the first arm 222. The vertical movement of the first arm 222 in combination with the pivoting movement of the other arms 224, 226 can allow the substrate holder 229 entry into and exit from the modules 232 at the three different vertical levels. Of course, more than three vertical levels of processing modules could be provided. In addition, the modules need not be aligned in vertical columns, such as if the modules in every other level were offset from adjacent levels. This might be needed to properly duct lines to the modules or provide areas for motors of some of the modules to operate.

Figure 8:
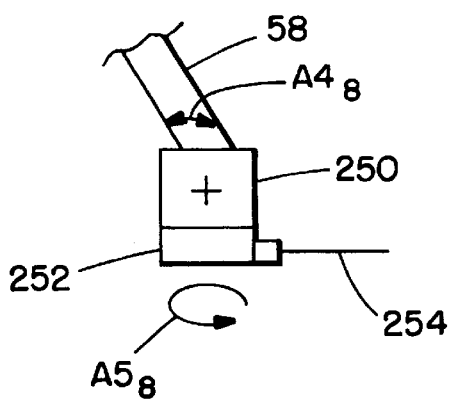
FIG. 8 is a schematic side view of an alternate embodiment of an articulating wrist.

Referring now to FIG. 8, an alternate embodiment of an articulating wrist 250 is shown. In this embodiment the second arm section 58 is pivotably connected to the top of the wrist 250 as indicated by arrow $A4_8$. The horizontal rotation section 252 is located at the bottom of the wrist 250 and can rotate as indicated by arrow $A5_8$. With this type of embodiment, the substrate holder 254 can be moved between opposite sides of the processing apparatus without rotating the arm about a main rotator. The arm would merely swing the wrist 250 back and forth, similar to a pendulum, with the rotator 252 changing the orientation of the substrate holder 254. In alternate embodiments, any suitable type of articulating wrist configuration could be provided.

It should be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. A substrate processing apparatus comprising:
    a substrate transport having a transport chamber and a transport mechanism for transporting substrates into and out of the transport chamber; and
    substrate processing chambers connected to the transport chamber, a first one of the processing chambers being vertically orientated in a plane above a second one of the processing chambers, wherein the transport mechanism can separately transport substrates into and out of the first and second processing chambers.

2. An apparatus as in claim 1 wherein the transport mechanism comprises a rotatable drive and an arm pivotably connected to the drive, the arm comprising two serially connected arm sections arranged to pivot in vertical directions.

3. An apparatus as in claim 2 wherein the transport mechanism further comprises a substrate holder connected to an end of the arm by an articulating wrist.

4. An apparatus as in claim 3 wherein the wrist is adapted to pivot relative to the arm in at least two different directions.

5. An apparatus as in claim 1 wherein the transport mechanism comprises a vertically pivotable arm with a substrate holder at an end of the arm.

6. An apparatus as in claim 5 further comprising means to maintain the substrate holder in a horizontal position as the arm is vertically pivoted.

7. An apparatus as in claim 1 wherein the processing chambers include a third one of the processing chambers being located in a first horizontal plane with the first processing chamber, the second processing chamber being located in a second vertically offset horizontal plane.

8. An apparatus as in claim 1 wherein the processing chambers comprise a frame stationarily connected to the transport chamber.

9. An apparatus as in claim 1 wherein the transport mechanism comprises:
 a rotatable drive;
 a first arm pivotably connected to the drive, the arm having a first arm section pivotably connected to a second arm section; and
 a first substrate holder pivotably connected to the second arm section, wherein at least one of the arm sections pivotably moves in a vertical direction when it is pivoted.

10. An apparatus as in claim 1 wherein the transport mechanism comprises:
 a first arm having two arm sections pivotably connected to each other to move in parallel vertical directions when they are pivoted relative to each other; and
 a substrate holder movably mounted to one of the arm sections by an articulating wrist, the wrist pivoting in at least one direction to maintain the substrate holder in a horizontal position.

11. A substrate processing apparatus comprising:
 a substrate transport having a transport chamber and a substrate transport mechanism;
 substrate processing chambers connected to the transport chamber, the processing chambers being located in at least two vertically different horizontal planes with at least one of the horizontal planes having at least two of the processing chambers,
 a controller for moving the substrate transport mechanism to insert and remove substrates from the processing chambers at the vertically different horizontal planes.

12. An apparatus as in claim 11 wherein the substrate transport mechanism has an arm with a substrate holder, the arm moving the substrate holder into and out of the transport chamber at the two horizontal planes.

13. An apparatus as in claim 12 wherein the arm is connected to a horizontally rotatable drive that angularly rotates the arm and the substrate holder about the drive.

14. An apparatus as in claim 13 wherein the substrate transport mechanism has joints and wherein the controller is connected to joint drivers at the joints.

15. An apparatus as in claim 14 wherein the controller maintains the substrate holder in a substantially horizontal position.

16. An apparatus as in claim 15 wherein the controller controls movement of the drive, the arm and a wrist between the arm and the substrate holder to move the substrate holder substantially straight into and out of the substrate processing chambers.

17. An apparatus as in claim 16 wherein the arm has two arm sections pivotally connected to each other and pivotably connected to the drive to only pivotably vertically move relative to the drive.

18. An apparatus as in claim 17 further comprising sensors connected to the controller for signaling the position of the drive, the arm sections and the substrate holder relative to each other.

19. A substrate processing apparatus comprising:
 a transport chamber;
 at least two substrate processing chambers connected to the transport chamber, the at least two substrate processing chambers being vertically offset, at least partially, relative to each other; and
 a robot located at least partially in the transport chamber for moving substrates in the transport chamber into and out of the vertically offset at least two substrate processing chambers.

20. A substrate processing apparatus as in claim 19 wherein the at least two substrate processing chambers each have a separate frame stationarily connected to the transport chamber.

21. A substrate processing apparatus as in claim 19 wherein the at least two substrate processing chambers are at least partially vertically aligned with each other.

22. A substrate processing apparatus as in claim 19 further comprising a third substrate processing chamber connected to the transport chamber and aligned in a horizontal plane with at least one of the at least two substrate processing chambers.

23. A substrate processing apparatus comprising:
 a transport chamber;
 at least two substrate processing chambers connected to the transport chamber;
 a robot for moving substrates between the transport chamber and the at least two substrate processing chambers,
 wherein a separate substrate transport passageway is provided between the transport chamber and each of the at least two substrate processing chambers, and wherein the separate passageways are vertically offset from one another.

24. A substrate processing apparatus as in claim 23 wherein the at least two substrate processing chambers each comprise a frame stationarily connected to the transport chamber.

* * * * *